(12) United States Patent
Jyousaka et al.

(10) Patent No.: US 7,897,897 B2
(45) Date of Patent: Mar. 1, 2011

(54) TEMPERATURE SETTING METHOD OF THERMAL PROCESSING PLATE, COMPUTER-READABLE RECORDING MEDIUM RECORDING PROGRAM THEREON, AND TEMPERATURE SETTING APPARATUS FOR THERMAL PROCESSING PLATE

(75) Inventors: Megumi Jyousaka, Koshi (JP); Yoshitaka Konishi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 413 days.

(21) Appl. No.: 11/934,303

(22) Filed: Nov. 2, 2007

(65) Prior Publication Data
US 2008/0116195 A1 May 22, 2008

(30) Foreign Application Priority Data
Nov. 7, 2006 (JP) .............................. 2006-301822

(51) Int. Cl.
*H05B 1/02* (2006.01)
(52) U.S. Cl. ...................... 219/482; 219/494; 392/418
(58) Field of Classification Search .............. 219/444.1, 219/494, 482, 483, 490; 700/207, 300; 427/487; 396/578, 626; 430/30
See application file for complete search history.

(56) References Cited

U.S. PATENT DOCUMENTS 6,402,509 B1 * 6/2002 Ookura et al. .............. 432/253
6,457,882 B2 * 10/2002 Ogata et al. ................. 396/578
6,722,798 B2   4/2004 Senba et al.
7,049,553 B2 * 5/2006 Shigetomi et al. ........... 219/482
2004/0186622 A1 * 9/2004 Aiuchi et al. ............... 700/241
2004/0250762 A1 * 12/2004 Shigetomi et al. .......... 118/684
2005/0188341 A1 * 8/2005 Fukuhara et al. ............... 716/19

FOREIGN PATENT DOCUMENTS

| JP | 2001-143850 | 5/2001 |
| JP | 2003-209093 | 7/2003 |
| JP | 2006-128572 | 5/2006 |

* cited by examiner

*Primary Examiner*—Mark H Paschall
*Assistant Examiner*—Brian Jennison
(74) *Attorney, Agent, or Firm*—Oblon, Spivak, McClelland, Maier & Neustadt, L.L.P.

(57) ABSTRACT

In the present invention, a thermal plate of a PEB unit is divided into a plurality of thermal plate regions, and a temperature is settable for each of the thermal plate regions. A temperature correction value for adjusting the temperature within the thermal plate is settable for each of the thermal plate regions of the thermal plate. The line widths within the substrate which has been subjected to the photolithography process are measured, and an improvement in-plane tendency Za improved by change of the temperature settings is subtracted from an in-plane tendency Z of the measured line widths within the substrate to calculate an in-plane tendency Zb of the line widths within the substrate after change of temperature settings. The improvement in-plane tendency Za is calculated using the following expression.

$Za = -1 \times \alpha \times MT$ ($\alpha$: a resist heat sensitivity, M: a calculation model, and T: temperature correction values for thermal plate regions).

10 Claims, 12 Drawing Sheets

CURRENT MEASUREMENT IN-PLANE TENDENCY Z — IMPROVEMENT IN-PLANE TENDENCY Za = IN-PLANE TENDENCY Zb AFTER CHANGE OF TEMPERATURE SETTINGS $$M = \begin{pmatrix} M_{11}, M_{12}, & \cdots & M_{1m} \\ M_{21}, M_{22}, & \cdots & M_{2m} \\ \vdots & \ddots & \vdots \\ M_{n1}, M_{n2}, & \cdots & M_{nm} \end{pmatrix}$$

$$\begin{pmatrix} T_1 \\ T_2 \\ T_3 \\ T_4 \\ T_5 \end{pmatrix} \fallingdotseq -1 \times 1/\alpha \times M^{-1} \begin{pmatrix} Z_1 \\ Z_2 \\ Z_3 \\ \vdots \\ Z_n \end{pmatrix} \quad \cdots\cdots(2)$$

FIG.13
$$Za = \begin{pmatrix} Z_1 \\ Z_2 \\ Z_3 \\ \vdots \\ Z_n \end{pmatrix} = -1 \times \alpha \times M \begin{pmatrix} T_1 \\ T_2 \\ T_3 \\ T_4 \\ T_5 \end{pmatrix} \quad \cdots\cdots (1)$$
FIG.14
CURRENT MEASUREMENT IN-PLANE TENDENCY Z
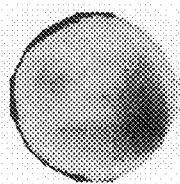
=
IMPROVABLE IN-PLANE TENDENCY Zc
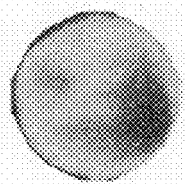
+
UNIMPROVABLE IN-PLANE TENDENCY Zd
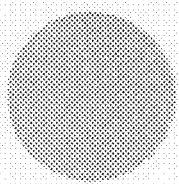

TEMPERATURE SETTING METHOD OF THERMAL PROCESSING PLATE, COMPUTER-READABLE RECORDING MEDIUM RECORDING PROGRAM THEREON, AND TEMPERATURE SETTING APPARATUS FOR THERMAL PROCESSING PLATE

BACKGROUND OF THE INVENTION

1. Field of the Invention

The present invention relates to a temperature setting method of a thermal processing plate, a computer-readable recording medium recording a program thereon, and a temperature setting apparatus for a thermal processing plate.

2. Description of the Related Art

In a photolithography process in manufacturing, for example, a semiconductor device, for example, a resist coating treatment of applying a resist solution onto a wafer to form a resist film, exposure processing of exposing the resist film into a predetermined pattern, heating processing of accelerating the chemical reaction in the resist film after exposure (post-exposure baking), and developing treatment of developing the exposed resist film are performed in sequence, so that the series of wafer processing forms a predetermined resist pattern on the wafer.

For example, the heating processing such as the above-described post-exposure baking is usually performed in a heating processing apparatus. The heating processing apparatus includes a thermal plate for mounting and heating the wafer thereon. The thermal plate has a heater embedded therein which generates heat by power feeding, and the heat generated by the heater adjusts the thermal plate to a predetermined temperature.

The thermal processing temperature in the above-described heating processing greatly affects the line width of the resist pattern to be finally formed on the wafer. Hence, to strictly control the temperature within the wafer during heating, the thermal plate of the above-described heating processing apparatus is divided into a plurality of regions, and an independent heater is embedded in each of the regions to adjust the temperature for each of the regions.

It is known that if the temperature adjustment for all of the regions of the above-described thermal plate is performed at the same set temperature, the temperature may vary within the wafer on the thermal plate, for example, due to the difference in thermal resistance between the regions, eventually resulting in variations in the line width of the resist pattern. For this reason, a temperature correction value (a temperature offset value) is set for each of the regions of thermal plate to finely adjust the in-plane temperature of the thermal plate (Japanese Patent Application Laid-open No. 2001-143850).

For setting the above-described temperature correction values, usually, the current line widths within the wafer are first measured, and an operator sets appropriate temperature correction values according to his/her experience and knowledge in consideration of measurement results. Thereafter, the line widths within the wafer are measured again, and the operator changes the temperature correction values in consideration of the line width measurement results. After operations of the line width measurement and the change of the temperature correction values are repeated through a try and error process, the operator ends the setting of the temperature correction values at a point in time when the operator judges that an appropriate line width has been obtained.

However, it is difficult to judge whether or not the line width by the temperature setting at that point in time is appropriate halfway through the temperature setting operation in the above-described temperature setting since a line width to be finally reached is not correctly known, and therefore the operator usually ends the temperature setting operation at the point in time when the operator judges that the line width has become appropriate by his/her subjectivity. As a result, an optimal temperature setting may not have been made, thus causing variations, among operators, in line widths within the wafer after the temperature setting. Further, if a finally optimal line width is not known, the operator sometimes performs change of the temperature setting a number of times through a try and error process, thus taking a long time for the temperature setting operation.

SUMMARY OF THE INVENTION

The present invention has been developed in consideration of the above points, and its object is, in the temperature setting of a thermal processing plate such as a thermal plate, to accurately estimate processing states of a substrate such as a wafer after change of the temperature settings and perform the temperature setting of the thermal processing plate in a short time and properly.

The present invention to attain the above object is a temperature setting method of a thermal processing plate when mounting and thermally processing a substrate thereon, the thermal processing plate being divided into a plurality of regions, a temperature being settable for each of the regions, and a temperature correction value for adjusting an in-plane temperature being settable for each of the regions. In the present invention, processing states of the substrate for the substrate which has been subjected to a series of substrate processing including the thermal processing are measured; and an improvement component improved by change of the temperature correction values for the regions of the thermal processing plate is subtracted from the measured processing states of the substrate to calculate processing states of the substrate after the change of the temperature correction values for the thermal processing plate.

The improvement component is found by the following expression.

$$Za = -1 \times \alpha \times F(T)$$

where $Za$: an improvement component, $\alpha$: a conversion coefficient between the temperature variation amounts within the substrate and the processing states of the substrate, $F(T)$: a function of the temperature correction values for the regions of the thermal processing plate and the temperature variation amounts within the substrate, and $T$: temperature correction values for the regions of the thermal processing plate.

According to the present invention, an improvement component improved by change of the temperature setting of the thermal processing plate of the current processing stated of the substrate is obtained using a predetermined expression, and the improvement component is subtracted from the current processing states of the substrate to calculate the processing states of the substrate after change of the temperature setting. Therefore, the processing states of the substrate after change of the temperature setting can be accurately estimated irrespective of, for example, the level of skill of an operator. As a result, it is unnecessary to repeat the change of the temperature setting through a try and error process, so that the temperature setting of the thermal processing plate can be performed in a short time and properly.

The temperature correction values T for the regions of the thermal processing plate may be approximate values. In this case, the temperature correction values T are obtained by calculating a plurality of in-plane tendency components from the measured processing states of the substrate, and performing approximate calculation of the temperature correction values to bring an in-plane tendency component improvable by the change of the temperature correction values for the regions of the thermal processing plate of the plurality of in-plane tendency components to 0 (ZERO).

The processing states of the substrate and the improvement component may be decomposed using a Zernike polynomial into and expressed in a plurality of in-plane tendency components.

The series of substrate processing may be processing of forming a resist pattern on the substrate in a photolithography process. Further, the processing states within the substrate may be line widths of the resist pattern. The thermal processing may be heating processing performed after exposure processing and before developing treatment.

According to the present invention according to another aspect, the above-described temperature setting method of a thermal processing plate may be, for example, computer-programmed and stored in a computer-readable recording medium.

The present invention according to another aspect is a temperature setting apparatus for a thermal processing plate for mounting and thermally processing a substrate thereon, the thermal processing plate being divided into a plurality of regions, a temperature being settable for each of the regions, and a temperature correction value for adjusting an in-plane temperature of the thermal plate being settable for each of the regions of the thermal plate. The temperature setting apparatus of the present invention includes a function of: measuring processing states of the substrate for the substrate which has been subjected to a series of substrate processing including the thermal processing; and subtracting an improvement component improved by change of the temperature correction values for the regions of the thermal processing plate from the measured processing states of the substrate to calculate processing states of the substrate after the change of the temperature correction values for the thermal processing plate.

The improvement component is found by the following expression.

$$Za = -1 \times \alpha \times F(T)$$

where Za: an improvement component, α: a conversion coefficient between the temperature variation amounts within the substrate and the processing states of the substrate, F(T): a function of the temperature correction values for the regions of the thermal processing plate and the temperature variation amounts within the substrate, and T: temperature correction values for the regions of the thermal processing plate.

According to the present invention, the processing states of the substrate after change of the temperature settings of a thermal processing plate can be accurately estimated, so that the temperature setting of the thermal processing plate can be performed in a short time and properly.

BRIEF DESCRIPTION OF THE DRAWINGS

FIG. 13 is an expression (1) to calculate the improvement in-plane tendency by substituting temperature correction values thereinto;

FIG. 14 is an explanatory view showing contents into which the current in-plane tendency of the measured line widths within the wafer is divided into an improvable tendency and an unimprovable tendency;

DETAILED DESCRIPTION OF THE INVENTION

Figure 1:
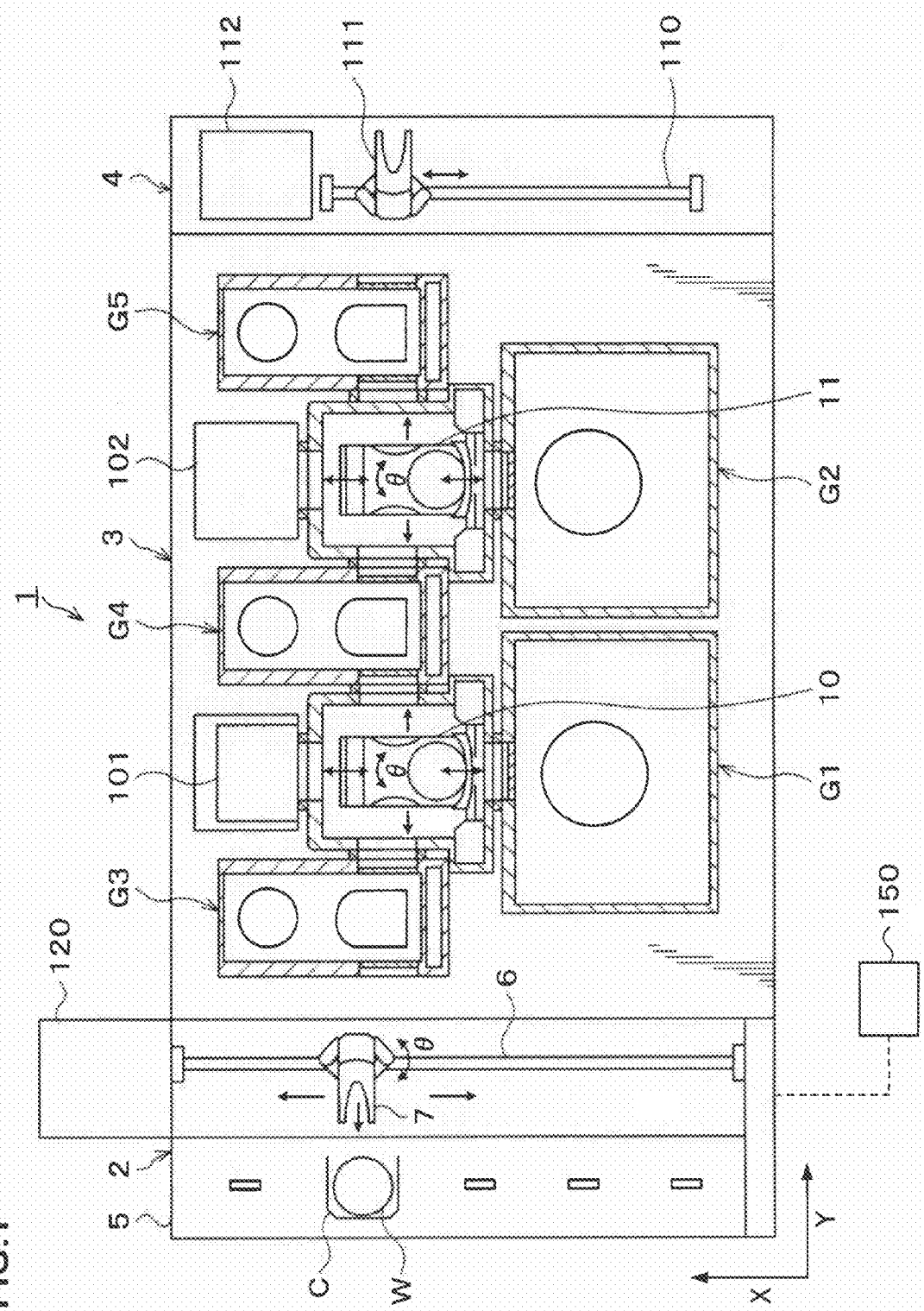
FIG. 1 is a plan view showing the outline of a configuration of a coating and developing treatment system.
Figure 2:
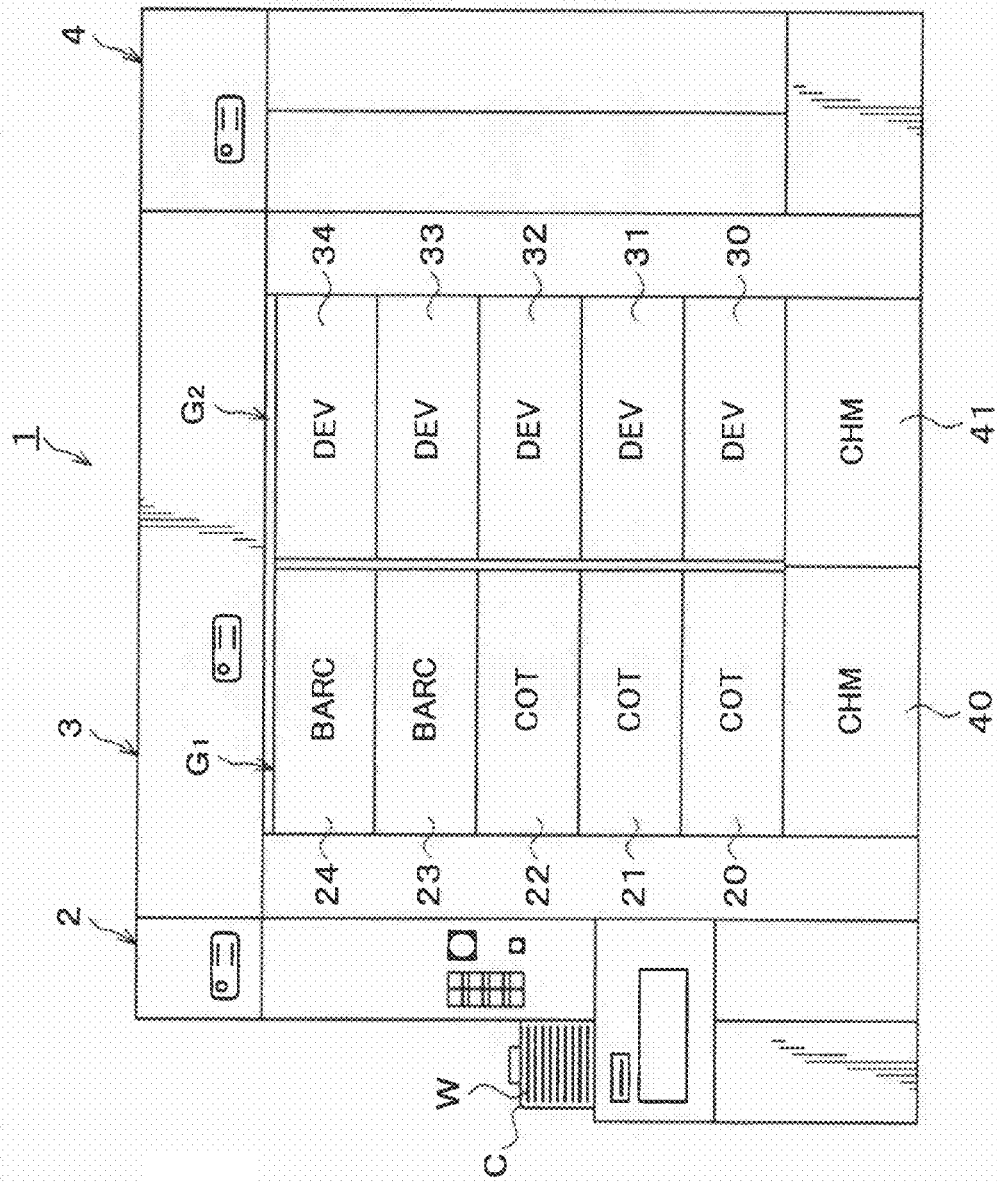
FIG. 2 is a front view of the coating and developing treatment system in FIG. 1.
Figure 3:
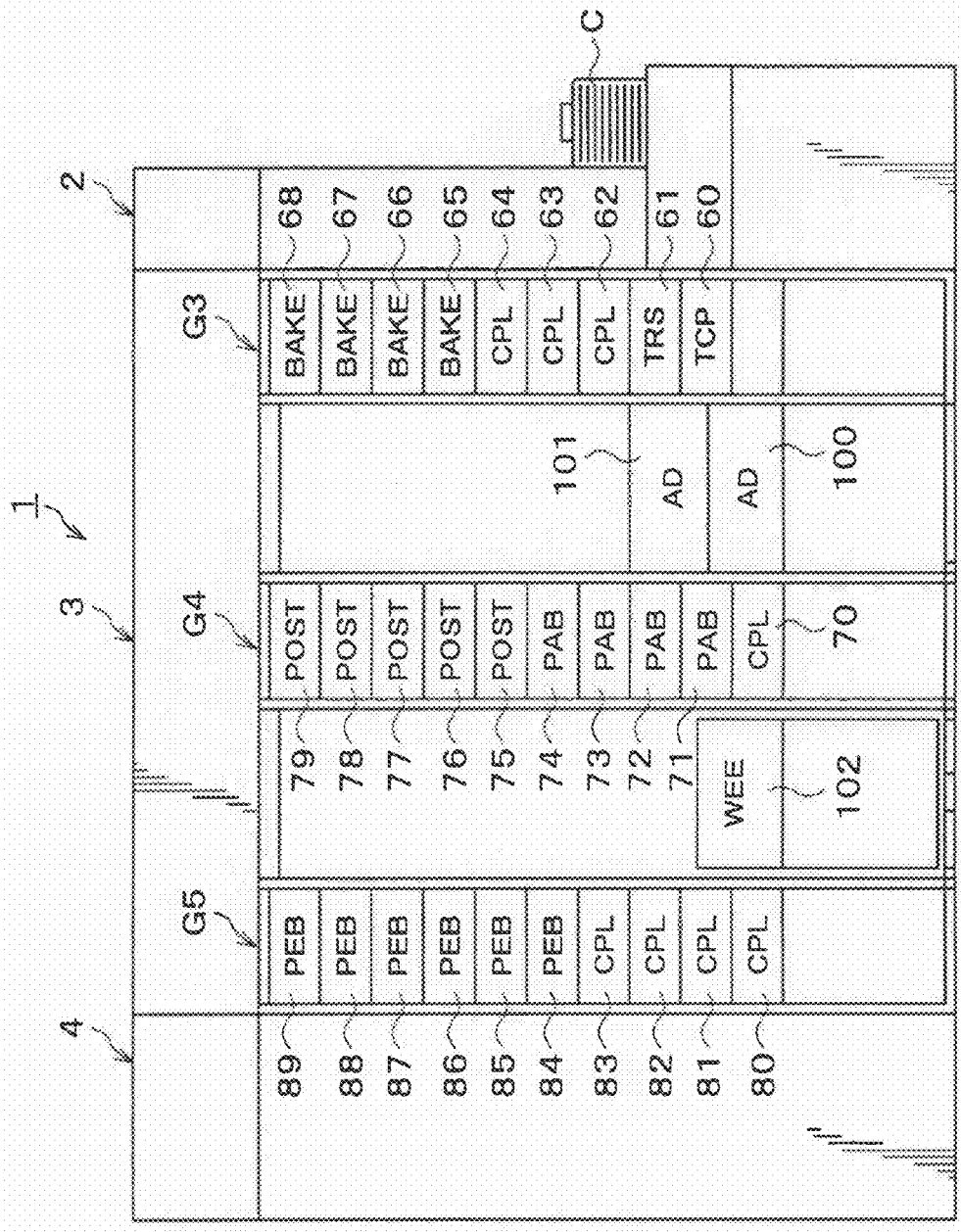
FIG. 3 is a rear view of the coating and developing treatment system in FIG. 1.

Hereinafter, a preferred embodiment of the present invention will be described. FIG. 1 is a plan view showing the outline of a configuration of a coating and developing treatment system 1 incorporating a temperature setting apparatus for a thermal processing plate according to the embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, 25 wafers W per cassette as a unit from/to the outside into/from the coating and developing treatment system 1 and transferring the wafers W into/out of a cassette C; a processing station 3 including a plurality of various kinds of processing and treatment units, which are multi-tiered, each for performing predetermined processing or treatment in a manner of single wafer processing in the photolithography process; and an interface station 4 for delivering the wafers W to/from a not-shown aligner provided adjacent to the processing station 3, are integrally connected together.

In the cassette station 2, a cassette mounting table 5 is provided and configured such that a plurality of cassettes C can be mounted thereon in a line in an X-direction (a top-to-bottom direction in FIG. 1). In the cassette station 2, a wafer transfer body 7 is provided which is movable in the X-direction on a transfer path 6. The wafer transfer body 7 is also movable in a wafer arrangement direction of the wafers W housed in the cassette C (a Z-direction; the vertical direction), and thus can selectively access the wafers W in each of the cassettes C arranged in the X-direction.

The wafer transfer body 7 is rotatable in a θ-direction around a Z-axis, and can access a temperature regulating unit 60 and a transition unit 61 included in a later-described third processing unit group G3 on the processing station 3 side.

The processing station 3 adjacent to the cassette station 2 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first transfer unit 10 is provided.

The first transfer unit 10 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 11 is provided. The second transfer unit 11 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W, and bottom coating units 23 and 24 each for forming an anti-reflection film that prevents reflection of light during exposure processing, are five-tiered in order from the bottom. In the second processing unit group G2, solution treatment units, for example, developing treatment units 30 to 34 each for supplying a developing solution to the wafer W to develop it are five-tiered in order from the bottom. Further, chemical chambers 40 and 41 for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, the temperature regulating unit 60, the transition unit 61 for passing the wafer W, high-precision temperature regulating units 62 to 64 each for temperature-regulating the wafer W under a high precision temperature control, and high-temperature thermal processing units 65 to 68 each for heat-processing the wafer W at a high temperature, are nine-tiered in order from the bottom.

In the fourth processing unit group G4, for example, a high-precision temperature regulating unit 70, pre-baking units 71 to 74 each for heat-processing the wafer W after resist coating treatment, and post-baking units 75 to 79 each for heat-processing the wafer W after developing treatment, are ten-tiered in order from the bottom.

In the fifth processing unit group G5, a plurality of thermal processing units each for thermally processing the wafer W, for example, high-precision temperature regulating units 80 to 83, and post-exposure baking units (hereinafter, referred to as "PEB units") 84 to 89 each for heat-processing the wafer W after exposure and before development, are ten-tiered in order from the bottom.

Figure 4:
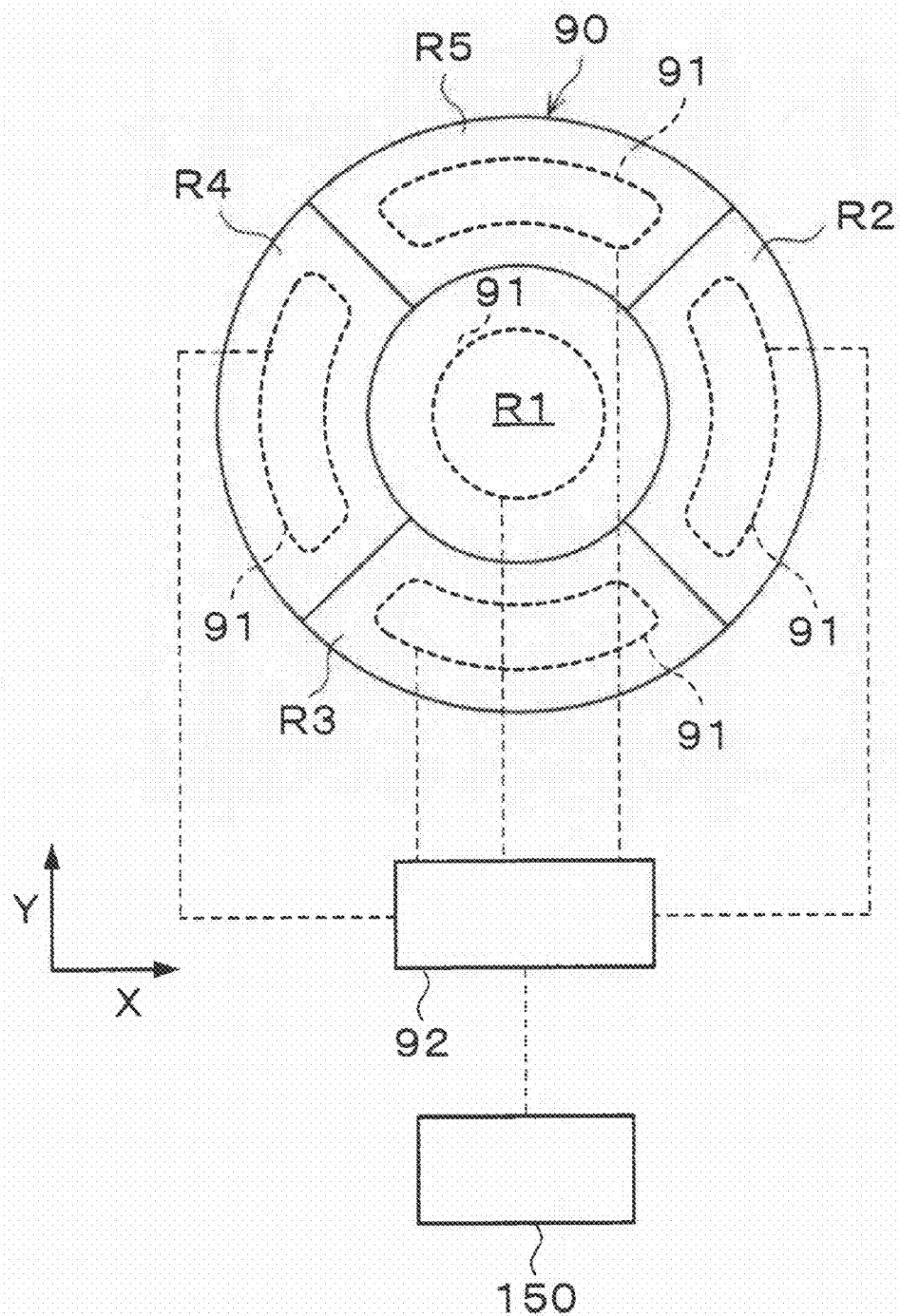
FIG. 4 is a plan view showing a configuration of a thermal plate in a PEB unit.

The PEB units 84 to 89 each include, for example, a thermal plate 90, as shown in FIG. 4, as a thermal processing plate for mounting and heating the wafer W thereon. The thermal plate 90 has an almost disk shape with a large thickness. The thermal plate 90 is divided into a plurality of, for example, five thermal plate regions $R_1$, $R_2$, $R_3$, $R_4$ and $R_5$. The thermal plate 90 is divided, for example, into the circular thermal plate region $R_1$ which is located at the central portion as seen in plan view and the thermal plate regions $R_2$ to $R_5$ which are made by equally dividing the peripheral portion around the thermal plate region $R_1$ into four sectors.

A heater 91 generating heat by power feeding is individually embedded in each of the thermal plate regions $R_1$ to $R_5$ of the thermal plate 90 and can heat each of the thermal plate regions $R_1$ to $R_5$. The heating value of each of the heaters 91 of the thermal plate regions $R_1$ to $R_5$ is adjusted, for example, by a temperature controller 92. The temperature controller 92 can adjust the heating value of the heater 91 to control the temperature of each of the thermal plate regions $R_1$ to $R_5$ to a predetermined set temperature. The temperature setting in the temperature controller 92 is performed, for example, by a later-described temperature setting apparatus 150.

As shown in FIG. 1, on the positive direction side in the X-direction to the first transfer unit 10, a plurality of processing and treatment units are arranged, for example, adhesion units 100 and 101 each for performing hydrophobic treatment on the wafer W being two-tiered in order from the bottom as shown in FIG. 3. As shown in FIG. 1, on the positive side in the X-direction to the second transfer unit 11, for example, an edge exposure unit 102 is disposed which selectively exposes only the edge portion of the wafer W to light.

In the interface station 4, for example, a wafer transfer body 111 moving on a transfer path 110 extending in the X-direction and a buffer cassette 112 are provided as shown in FIG. 1. The wafer transfer body 111 is movable in the vertical direction and also rotatable in the θ-direction, and thus can access the not-shown aligner adjacent to the interface station 4, the buffer cassette 112, and the fifth processing unit group G5 and transfer the wafer W to them.

In the coating and developing treatment system 1 configured as described above, for example, a series of wafer processing in the photolithography process as follows is performed. The unprocessed wafers W are first taken out by the wafer transfer body 7 one by one from the cassette C on the cassette mounting table 5, and successively transferred to the temperature regulating unit 60 in the third processing unit group G3. The wafer W transferred to the temperature regulating unit 60 is temperature-regulated to a predetermined temperature, and is then transferred by the first transfer unit 10 to the bottom coating unit 23, where an anti-reflection film is formed. The wafer W having the anti-reflection film formed thereon is transferred by the first transfer unit 10 to the high-temperature thermal processing unit 65 and the high-precision temperature regulating unit 70 in sequence so that predetermined processing is performed in each of the units.

Thereafter, the wafer W is transferred to the resist coating unit 20, where a resist film is formed on the wafer W. The wafer W is then transferred by the first transfer unit 10 to the pre-baking unit 71 and subjected to pre-baking. The wafer W is subsequently transferred by the second transfer unit 11 to the edge exposure unit 102 and the high-precision temperature regulating unit 83 in sequence so that the wafer W is subjected to predetermined processing in each of the units. The wafer W is then transferred by the wafer transfer body 111 in the interface station 4 to the not-shown aligner, where the wafer W is exposed to light. The wafer W for which exposure processing has been finished is transferred by the wafer transfer body 111, for example, to the PEB unit 84.

In the PEB unit 84, the wafer W is mounted on the thermal plate 90 which has been set to a predetermined temperature for each of the thermal plate regions $R_1$ to $R_5$ in advance to thereby be subjected to post-exposure baking.

The wafer W for which the post-exposure baking has been completed is transferred by the second transfer unit 11 to the high-precision temperature regulating unit 81, where the wafer W is temperature-regulated. The wafer W is then transferred to the developing treatment unit 30, where the resist film on the wafer W is developed. The wafer W is then transferred by the second transfer unit 11 to the post-baking unit 75, where the wafer W is subjected to post-baking. The wafer W is then transferred to the high-precision temperature regulating unit 63, where the wafer W is temperature-regulated. The wafer W is then transferred by the first transfer unit 10 to the transition unit 61 and returned to the cassette C by the wafer transfer body 7, thus completing the photolithography process being a series of wafer processing.

Figure 5:
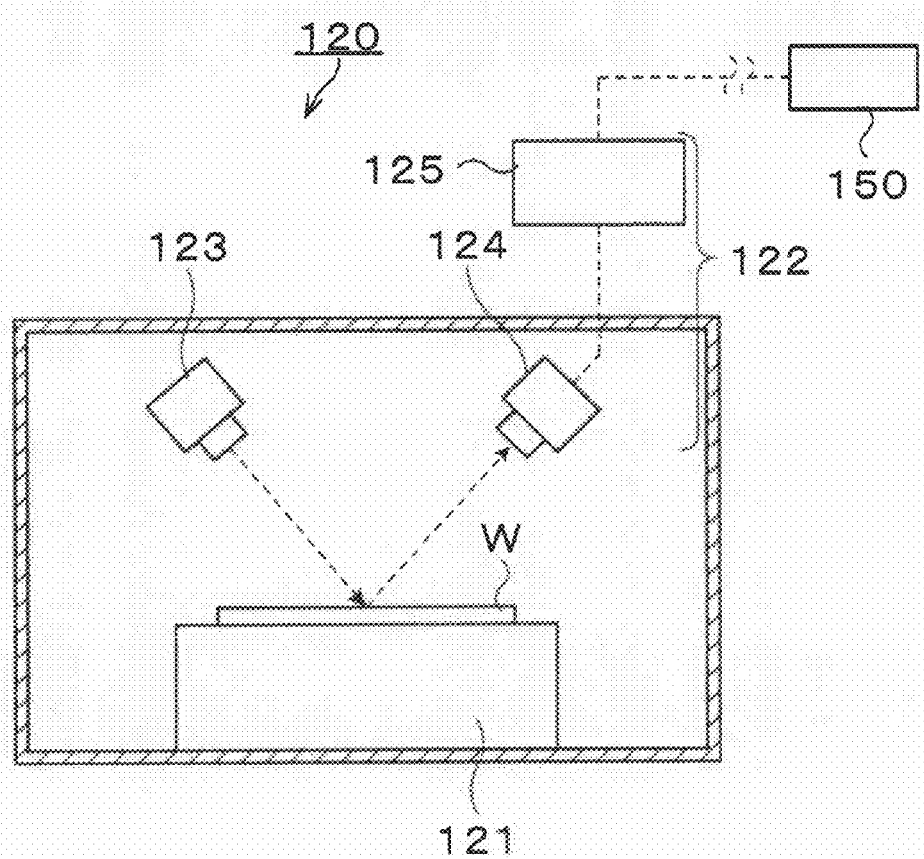
FIG. 5 is an explanatory view showing the outline of a configuration of a line width measuring unit.

Incidentally, a line width measuring unit 120 for measuring the line width of a resist pattern as the processing state within the substrate is provided as shown in FIG. 1 in the above-described coating and developing treatment system 1. The line width measuring unit 120 is provided, for example, in the cassette station 2. The line width measuring unit 120 includes, for example, a mounting table 121 for horizontally mounting the wafer W thereon as shown in FIG. 5 and an optical profilometer 122. The mounting table 121 forms, for example, an X-Y stage and can move in two dimensional directions in the horizontal directions. The optical profilometer 122 includes, for example, a light irradiation unit 123 for applying light to the wafer W from an oblique direction, a light detection unit 124 for detecting the light applied from the light irradiation unit 123 and reflected by the wafer W, and a calculation unit 125 for calculating the line width of the resist pattern on the wafer W based on light reception information from the light detection unit 124.

The line width measuring unit 120 according to this embodiment is for measuring the line width of the resist pattern, for example, using the Scatterometry method, in which the line width of the resist pattern can be measured in the calculation unit 125 by checking the light intensity distribution within the wafer detected by the light detection unit 124 against a virtual light intensity distribution stored in advance and obtaining a line width of the resist pattern corresponding to the checked virtual light intensity distribution.

The line width measuring unit 120 can measure the line widths at a plurality of locations within the wafer by horizontally moving the wafer W relative to the light irradiation unit 123 and the light detection unit 124. The measurement result of the line width measuring unit 120 can be outputted, for example, from the calculation unit 125 to a later-described temperature setting apparatus 150.

Next, the configuration of the temperature setting apparatus 150 for performing temperature setting of the thermal plate 90 in the above-described PEB units 84 to 89 will be described. The temperature setting apparatus 150 is composed of, for example, a general-purpose computer comprising a CPU and a memory. The temperature setting apparatus 150 is connected to the temperature controller 92 for the thermal plate 90 and the line width measuring unit 120 as shown in FIG. 4 and FIG. 5.

Figure 6:
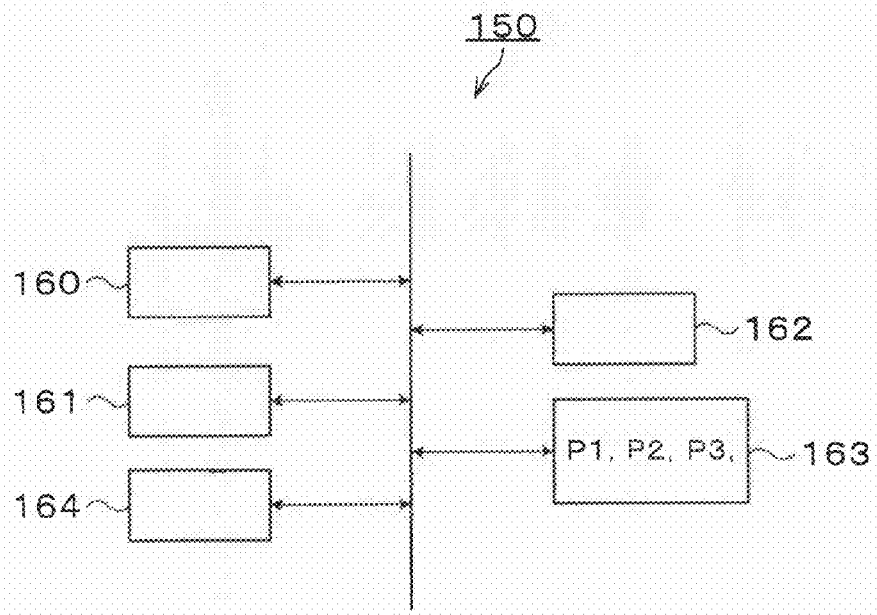
FIG. 6 is a block diagram showing a configuration of a temperature setting apparatus.

The temperature setting apparatus 150 comprises, for example, as shown in FIG. 6, a computing unit 160 for executing various kinds of programs; an input unit 161 for inputting, for example, various kinds of information for temperature setting of the thermal plate 90; a data storage unit 162 for storing the various kinds of information for temperature setting of the thermal plate 90; a program storage unit 163 for storing the various kinds of programs for temperature setting of the thermal plate 90; and a communication unit 164 for communicating the various kinds of information for temperature setting of the thermal plate 90 to/from the temperature controller 92 and the line width measuring unit 120.

Figure 7:
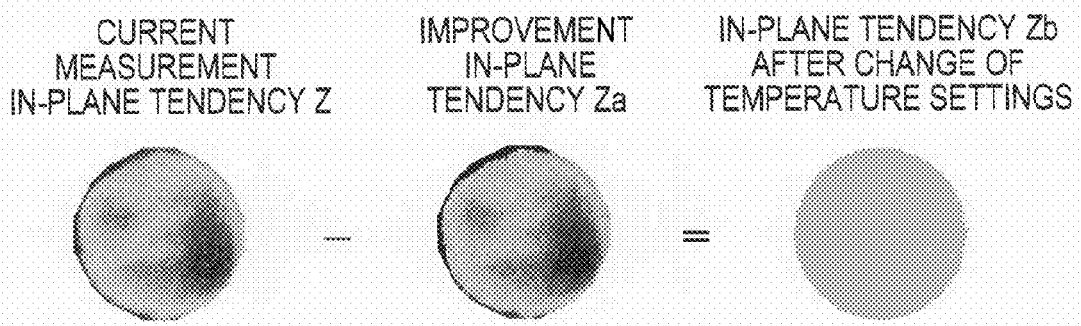
FIG. 7 is an explanatory view showing contents to calculate an in-plane tendency after change of the temperature settings by subtracting an improvement in-plane tendency from a current in-plane tendency of measured line widths within a wafer.

The program storage unit 163 stores, for example, a program P1 to estimate an in-plane tendency Zb of the line widths within the wafer after change (after improvement) of the settings of the temperature correction values for the thermal plate regions $R_1$ to $R_5$ by subtracting the improvement in-plane tendency Za as the improvement component found by a later-described expression from the in-plane tendency Z of the measured line widths within the wafer being the processing states of the substrate as shown in FIG. 7. This improvement in-plane tendency Za is the in-plane tendency of the line widths to be improved by change of the settings of the temperature correction values for the thermal plate regions $R_1$ to $R_5$.

Figures 8, 9:
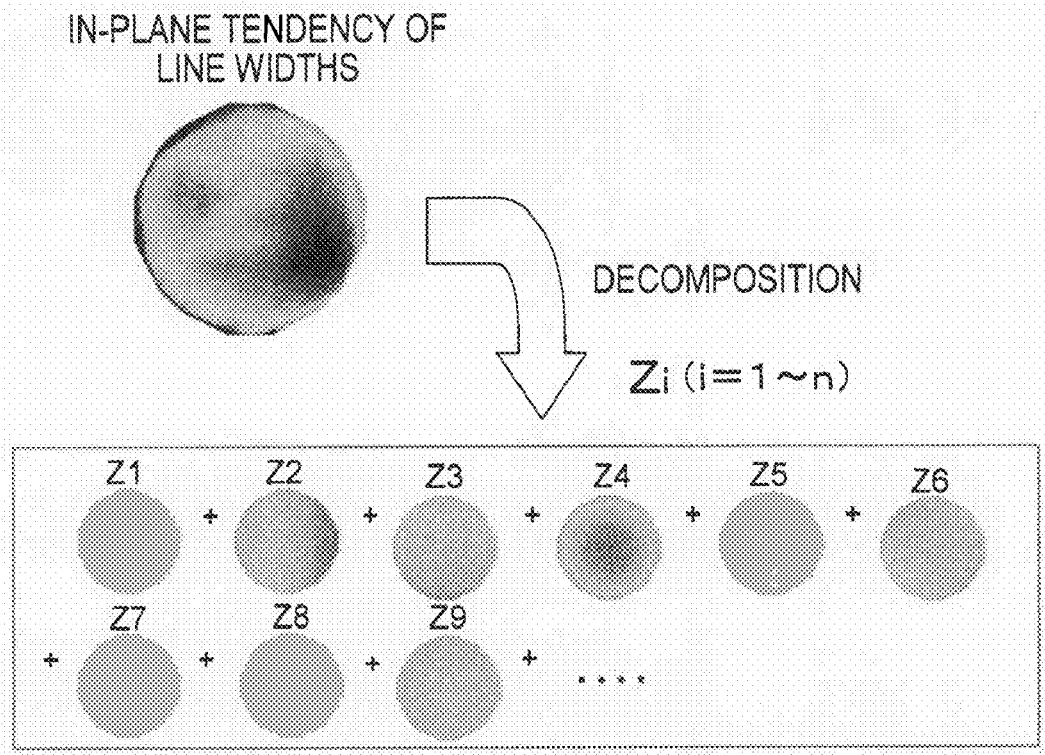
FIG. 8 is an explanatory view showing a state in which the in-plane tendency of the line widths within the wafer is decomposed into a plurality of in-plane tendency components using a Zernike polynomial.
FIG. 9 is a determinant showing an example of a calculation model.

For example, the in-plane tendency Z and the improvement in-plane tendency Za of the measured line widths within the wafer are expressed using a plurality of in-plane tendency components $Z_i$ (where i=1 to n, and n is an integer equal to or greater than 1) decomposed using a Zernike polynomial as shown in FIG. 8.

Adding here explanation about the Zernike polynomial, the Zernike polynomial is a complex function on a unit circle with a radius of 1 (practically used as a real function) which is often used in the optical field, and has arguments (r, θ) of polar coordinates.

The Zernike polynomial is mainly used to analyze the aberration component of a lens in the optical field, and the wavefront aberration is approximately decomposed using the Zernike polynomial, whereby aberration components based on the shape of each independent wavefront, for example, a mount shape, a saddle shape, or the like can be known.

In this embodiment, for example, the in-plane tendency Z, Za of the measured line widths within the wafer is expressed in the height direction above the wafer surface and grasped as a wavefront vertically waiving within the wafer. The above-described in-plane tendency Z, Za is expressed, for example, by a plurality of in-plane tendency components $Z_i$, decomposed using the Zernike polynomial, such as a deviation component in the Z-direction being the vertical direction, a gradient component in the X-direction, a gradient component in the Y-direction, and a curvature component convexly curving or concavely curving. The magnitude of each of the in-plane tendency components $Z_i$ can be expressed by the Zernike coefficient.

The Zernike coefficient indicating each of the in-plane tendency components $Z_i$ can be specifically expressed by the following expressions using the arguments (r, θ) of polar coordinates.

| | |
|---|---|
| Z1 | (1) |
| Z2 | $(r \cdot \cos\theta)$ |
| Z3 | $(r \cdot \sin\theta)$ |
| Z4 | $(2r^2 - 1)$ |
| Z5 | $(r^2 \cdot \cos 2\theta)$ |
| Z6 | $(r^2 \cdot \sin 2\theta)$ |
| Z7 | $((3r^3 - 2r) \cdot \cos\theta)$ |
| Z8 | $((3r^3 - 2r) \cdot \sin\theta)$ |
| Z9 | $(6r^4 - 6r^2 + 1)$ | and so on.

The Zernike coefficient Z1 indicates the line width average value within the wafer (the deviation component in the Z-direction), the Zernike coefficient Z2 indicates the gradient component in the X-direction, the Zernike coefficient Z3 indicates the gradient component in the Y-direction, and the Zernike coefficients Z4, Z9 indicate the curvature components, for example, in this embodiment.

The program storage unit 163 stores a program P2 to calculate the above-described improvement in-plane tendency Za using the following expression (1).

$$Za = -1 \times \alpha \times MT \qquad (1)$$

where in the expression (1), α is a resist heat sensitivity being a conversion coefficient between the temperature variation amounts within the wafer and the line widths of the wafer, and M is a calculation model as a function F(T) of the temperature correction values for the thermal plate regions $R_1$ to $R_5$ and the temperature variation amounts within the wafer. T is a temperature correction value for each of the thermal plate regions $R_1$ to $R_5$.

The calculation model M of the expression (1) is a correlation matrix indicating the correlation between the temperature variation amounts within the wafer and the temperature correction values T. Since the improvement in-plane tendency Za calculated by the expression (1) is expressed using a plurality of in-plane tendency components $Z_i$ decomposed by the Zernike polynomial as described above, the calculation model M is a determinant of n (the number of in-plane tendency components) rows by m (the number of thermal plate regions) columns expressed using the Zernike coefficients on a specific condition, for example, as shown in FIG. 9.

The calculation model M is made, for example, by raising the temperature of each of the thermal plate regions $R_1$ to $R_5$ in sequence by 1° C., measuring the temperature variation amounts at many points within the wafer in each case, calculating, from the temperature variation amounts at many points, the temperature variation amounts within the wafer corresponding to the in-plane tendency components $Z_i$ (Zernike coefficients), and expressing the temperature variation amounts per unit temperature variation of the thermal plate regions $R_1$ to $R_5$ as elements $M_{i,j}$ of the determinant ($1 \leq i \leq n$, and $1 \leq j \leq m$, m=5 being the number of thermal plate regions in this embodiment).

The program storage unit 163 stores a program P3 to calculate the temperature correction value T for each of the thermal plate regions $R_1$ to $R_5$.

The temperature correction value T for each of the thermal plate regions $R_1$ to $R_5$ is calculated, for example, using the following expression (2).

$$T \approx 1 \times 1/\alpha \times M^{-1'} Z \qquad (2)$$

In the expression (2), $M^{-1'}$ is a pseudo inverse matrix being an approximate inverse function of the calculation model M, and Z is an in-plane tendency of the measured line widths within the wafer. T is a temperature correction value for each of the thermal plate regions $R_1$ to $R_5$ calculated as an approximate value using the following expression (2).

Note that the above-described various kinds of programs for embodying the temperature setting process by the temperature setting apparatus 150 may be ones recorded on a recording medium such as a computer-readable CD and installed from the recording medium into the temperature setting apparatus 150.

Figure 10:
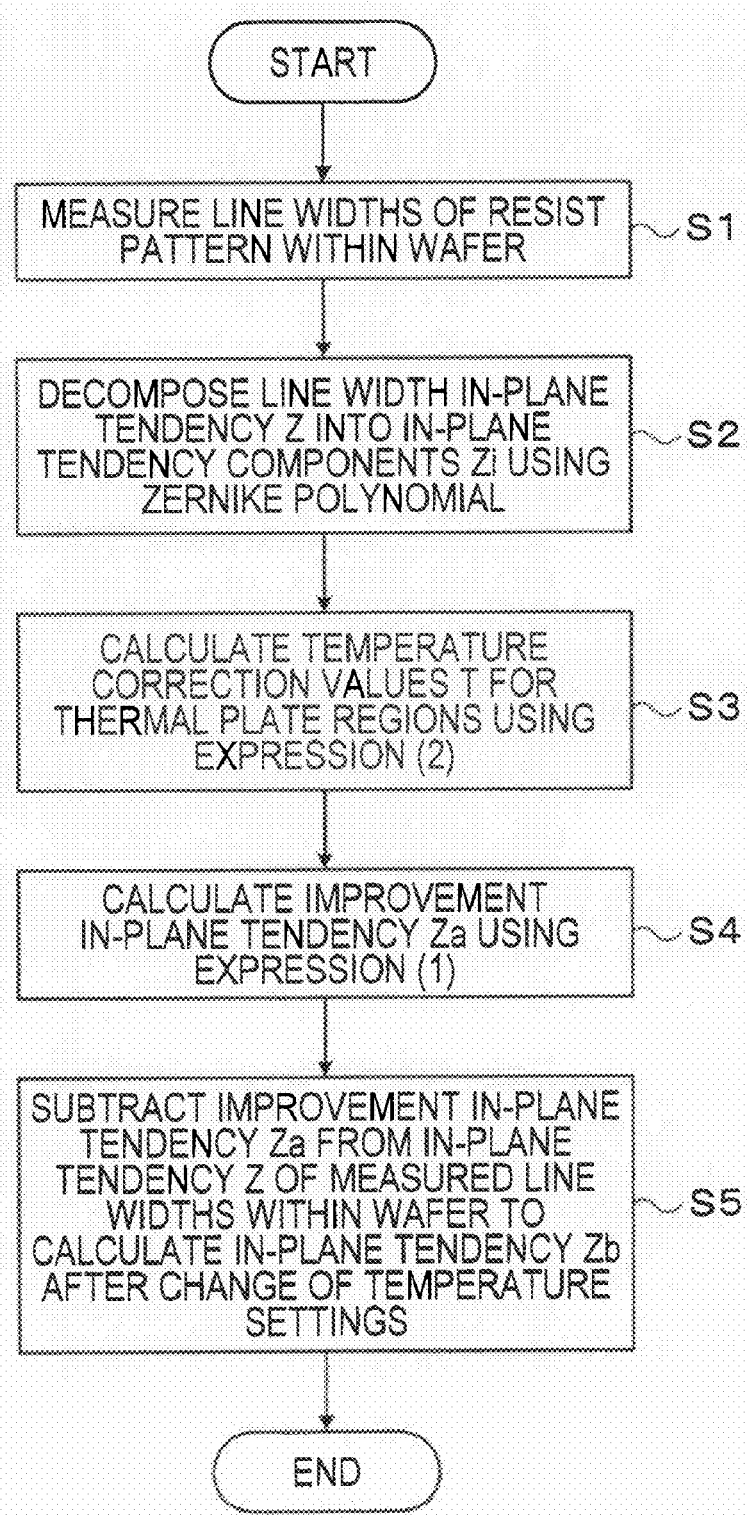
FIG. 10 is a flowchart showing a temperature setting process.

Next, the temperature setting process by the temperature setting apparatus 150 configured as described above will be described. FIG. 10 is a flowchart showing one example of the temperature setting process.

Figures 11, 12:
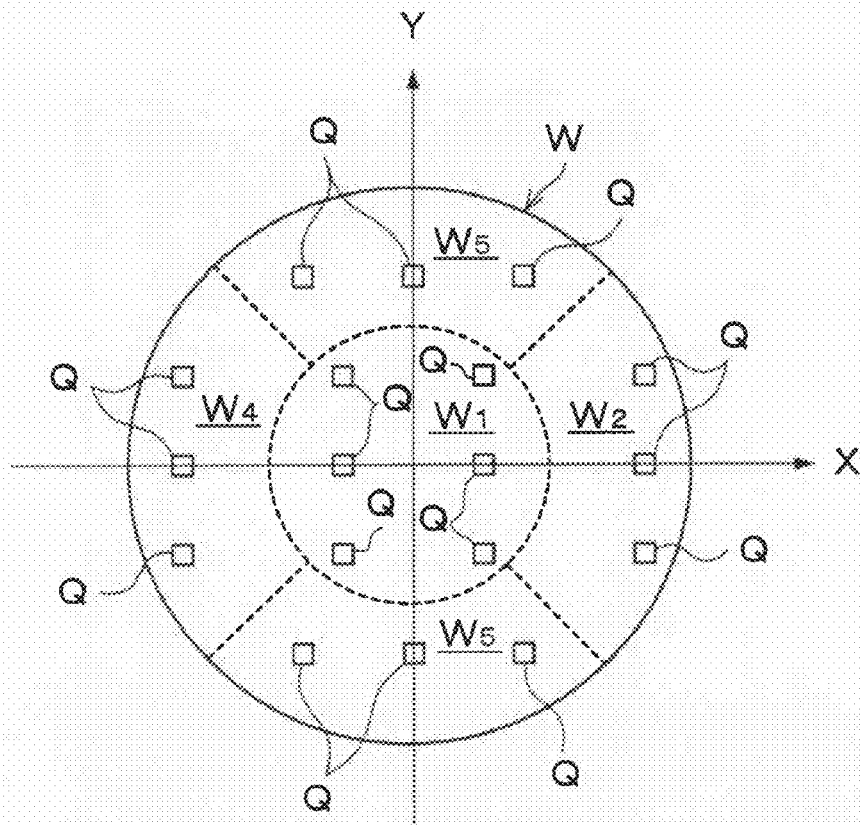
FIG. 11 is an explanatory view showing measurement points of the line widths within the wafer.
FIG. 12 shows an expression (2) to calculate temperature correction values by substituting in-plane tendency components of measured line widths thereinto.

For example, the wafer W for which the above-described series of photolithography processing has been finished, for example, is transferred into the line width measuring unit 120 in the cassette station 2, where the line widths of the resist pattern within the wafer W are measured (Step S1 in FIG. 10). In this event, the line widths at a plurality of measurement points Q within the wafer as shown in FIG. 11 are measured to measure at least the line widths in wafer regions $W_1$, $W_2$, $W_3$, $W_4$, and $W_5$ corresponding to the respective thermal plate regions $R_1$ to $R_5$ of the thermal plate 90.

The measurement results of the line widths within the wafer are outputted to the temperature setting apparatus 150. In the temperature setting apparatus 150, for example, from measured values of the line widths at the plurality of measurement points Q in the wafer regions $W_1$ to $W_5$, the in-plane tendency Z of the measured line widths within the wafer is calculated, and the plurality of in-plane tendency components $Z_i$ (i=1 to n) are calculate from the in-plane tendency Z using the Zernike polynomial as shown in FIG. 8 (Step S2 in FIG. 10).

Subsequently, the temperature correction value T is calculated for each of the thermal plate regions $R_1$ to $R_5$ of the thermal plate 90 using the expression (2). In this event, the in-plane tendency component $Z_i$ (i=1 to n) of the above-described in-plane tendency Z of the measured line widths within the wafer are substituted into the term of Z of the expression (2) as shown in FIG. 12. The plurality of in-plane tendency component $Z_i$ of the measured line widths can be divided into, for example, in-plane tendency components improvable by change of the temperature settings, such as Z1, Z2, Z3, Z4, and Z9 and unimprovable in-plane tendency components other than those. Approximate calculation is performed using the calculation model $M^{-1'}$ of the pseudo inverse matrix by the expression (2) to calculate the temperature correction values $T_1$, $T_2$, $T_3$, $T_4$, and $T_5$ for the thermal plate regions $R_1$ to $R_5$ which are approximate values to bring the improvable in-plane tendency components to 0 (ZERO) of the plurality of in-plane tendency components $Z_i$ (Step S3 in FIG. 10).

Next, the improvement in-plane tendency Za is calculated using the expression (1). In this event, the above-described temperature correction values $T_1$ to $T_5$ are substituted into the term of T of the expression (1) as shown in FIG. 13. This expression (1) is used to find the in-plane tendency components $Z_i$, thus calculating the improvement in-plane tendency Za (Step S4 in FIG. 10). Note that some of the in-plane tendency components $Z_i$ which are of values other than 0 (ZERO) form the in-plane tendency components improved by the setting of the temperature correction values $T_1$ to $T_5$.

Subsequently, the improvement in-plane tendency Za is subtracted from the above-described in-plane tendency Z of the measured line widths to calculate an in-plane tendency Zb of the line widths after change of the temperature settings as shown in FIG. 7 (Step S5 in FIG. 10). Thereafter, the change of the settings of the temperature correction values for the thermal plate regions $R_1$ to $R_5$ is performed in consideration of the in-plane tendency Zb of the line widths after change of the temperature settings.

According to the above embodiment, the in-plane tendency Zb of the line widths after change of the temperature settings is estimated by calculating the improvement in-plane tendency Za using the expression (1) from the measurement results of the current line widths within the wafer and subtracting the improvement in-plane tendency Za from the current in-plane tendency Z of the measured line widths within the wafer. This allows for accurate calculation of the in-plane tendency Zb of the line widths after change of the temperature settings without relaying on the knowledge and experience of an operator as in the prior art, thus eliminating the necessity of repeated performance of change of the settings of the temperature correction values many times as in the prior art, with the result that the temperature setting of the thermal plate 90 can be performed in a short time and properly.

Incidentally, when estimating the in-plane tendency Zb of the line widths after change of the temperature settings, it is also conceivable to directly obtain the in-plane tendency Zb after change of the temperature settings by dividing the in-plane tendency Z of the line widths within the wafer obtained from the measured values within the wafer into, for example, a theoretically improvable in-plane tendency Zc and an unimprovable in-plane tendency Zd as shown in FIG. 14, and subtracting the improvable in-plane tendency Zc from the in-plane tendency Z of the measured line widths within the wafer. This is on the assumption that the change of the settings of the temperature correction values brings the theoretically improvable in-plane tendency Zc completely to 0 (ZERO), but actually it is impossible to obtain temperature correction values to bring the improvable in-plane tendency Zc to 0 (ZERO) and set them.

The temperature correction values T for the thermal plate regions to bring the improvable in-plane tendency Zc to 0 (ZERO) are, for example, found by the expression (2) as described above to be approximate values. More specifically, since usually the number of the in-plane tendency components $Z_i$ of the in-plane tendency Z of the line widths differs from the number of the temperature correction values of the thermal plate regions, there is no inverse function of the calculation model M being the correlation between the in-plane tendency components $Z_i$ of the line widths and the temperature variations of the thermal plate regions. In addition, instead of the inverse function of the calculation model M, the pseudo inverse matrix $M^{-1'}$ is used as in the expression (2), so that the temperature correction values T are approximate values. Since the temperature correction values T are approximate values as described above, it is impossible to bring the theoretically improvable in-plane tendency Zc completely to 0 (ZERO) even if the temperature correction values T are actually set. Accordingly, estimation of the in-plane tendency Zb after change of the temperature settings on the assumption that the improvable in-plane tendency Zc is completely brought to 0 (ZERO) as shown in FIG. 14 results in decreased accuracy thereof.

In contrast, in this embodiment, the improvement in-plane tendency Za to be actually improved is obtained using the expression (1) from the temperature correction values T to be actually inputted and the improvement in-plane tendency Za is subtracted from the in-plane tendency Z of the measured line widths within the wafer, whereby the unimprovable in-plane tendency, that is, the in-plane tendency Zb after change of the temperature settings can be calculated. In other words, since the in-plane tendency Zb after change of the temperature settings is calculated based on the improvement in-plane tendency Za to be actually improved, the states of the in-plane tendency after change of the temperature settings can be estimated more accurately.

Furthermore, the temperature correction value T to be inputted into the temperature controller 92 for the thermal plate 90 is a numerical value of a specific number of digits conforming to specifications of the temperature controller for the thermal plate 90, and obtained from a calculated value found by the expression (2) and further subjected to fraction processing. Accordingly, the difference between the temperature correction values to bring the theoretically improvable in-plane tendency to 0 (ZERO) and the temperature correction values to be actually inputted is much larger. Thus, also in this aspect, the in-plane tendency Zb after change of the temperature settings can be accurately estimated by calculating the improvement in-plane tendency Za using the expression (1) from the temperature correction values to be actually inputted and calculating the in-plane tendency Zb after change of the temperature settings from the improvement in-plane tendency Za.

Although the calculation model M is used as the function of the temperature correction values for the thermal plate regions and the temperature variation amounts within the wafer in the expression (1) in the above embodiment, another function F(T) such as a non-linear function may be used.

The in-plane tendency of the line widths within the wafer is decomposed into and expressed in the plurality of in-plane tendency components $Z_i$ using the Zernike polynomial in the above embodiment, and may be expressed by another method.

Figure 15:
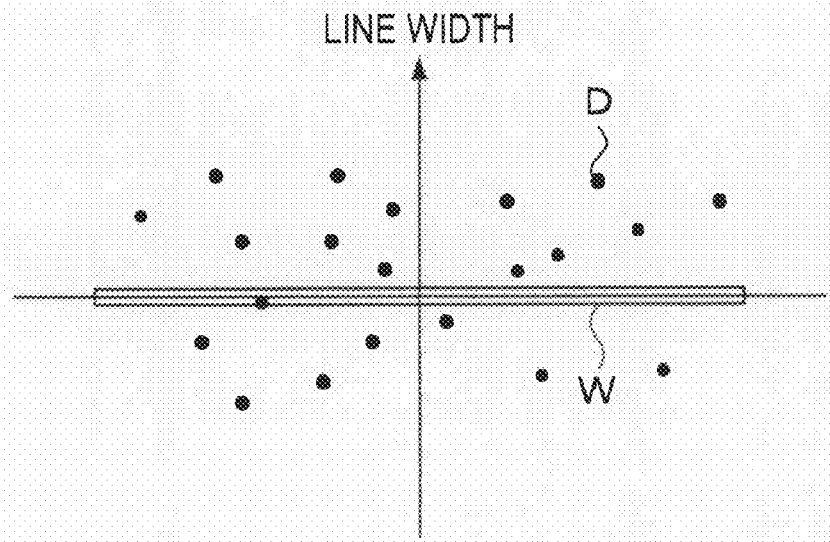
FIG. 15 is an explanatory view showing a variation tendency of the line width measured values.
Figure 16:
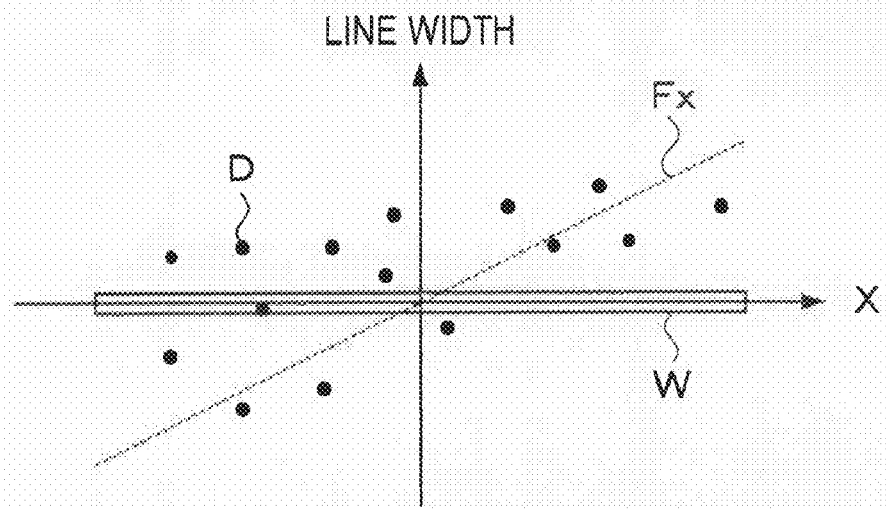
FIG. 16 is an explanatory view showing a gradient component in an X-direction of the variation tendency of the line width measured values.
Figure 17:
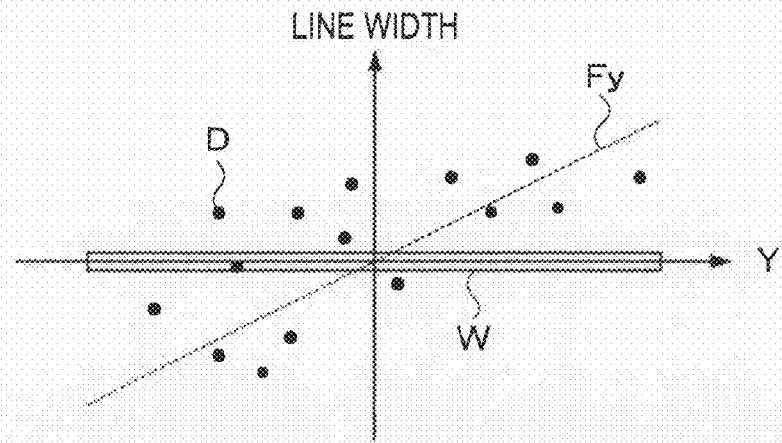
FIG. 17 is an explanatory view showing a gradient component in a Y-direction of the variation tendency of the line width measured values.
Figure 18:
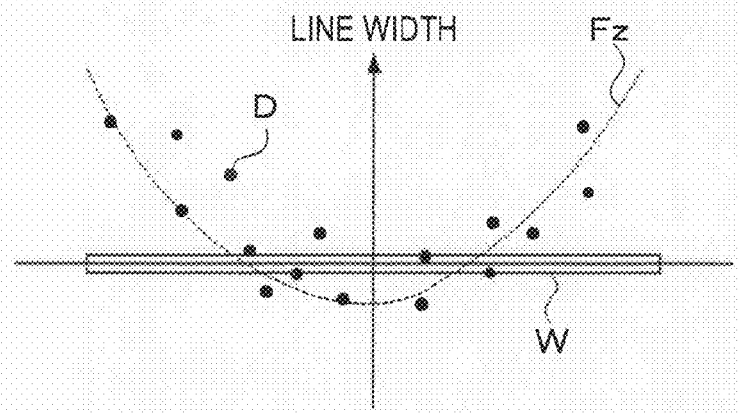
FIG. 18 is an explanatory view showing a curvature component of the variation tendency of the line width measured values.

The in-plane tendency of the measured line widths within the wafer is indicated by expressing line width measured values D at a plurality of measurement points Q within the wafer in the height direction above the wafer surface, for example, as shown in FIG. 15. The line width measured values D at the plurality of measurement points Q are projected to a vertical plane including an X-axis, for example, as shown in FIG. 16, and a gradient component Fx in the X-direction being one of the in-plane tendency components is calculated from the distribution of the line width measured values D using the least square method. The line width measured values D at the plurality of measurement points Q are also projected to a vertical plane including a Y-axis as shown in FIG. 17, and a gradient component Fy in the Y-direction being one of the in-plane tendency components is calculated from the distribution of the line width measured values D using the least square method. Furthermore, a convex curvature component Fz being one of the in-plane tendency components is calculated as shown in FIG. 18 by subtracting the gradient component Fx in the X-direction and the gradient component Fy in the Y-direction from the whole in-plane tendency of the line width measured values D. This makes it possible that the in-plane tendency Z and the improvement in-plane tendency Za of the line widths within the wafer can be decomposed into and expressed in the in-plane tendency components Fx, Fy, and Fz.

Incidentally, the change of the temperature setting of the thermal plate 90 may be performed, for example, only when the magnitude of the improvement in-plane tendency Za (the degree of variations) exceeds a threshold value which has determined in advance.

In this case, every several wafers W which are being successively processed in the coating and developing treatment system 1 are periodically subjected to line width measurement. From the result of the measured line widths within the wafer obtained by the line width measurement, the improvement in-plane tendency Za is obtained using the expression (1) and the expression (2) as described above, and whether or not, for example, the value of 3σ (sigma) indicating the magnitude of the improvement in-plane tendency Za exceeds a threshold value which has been set in advance is judged.

Figure 19:
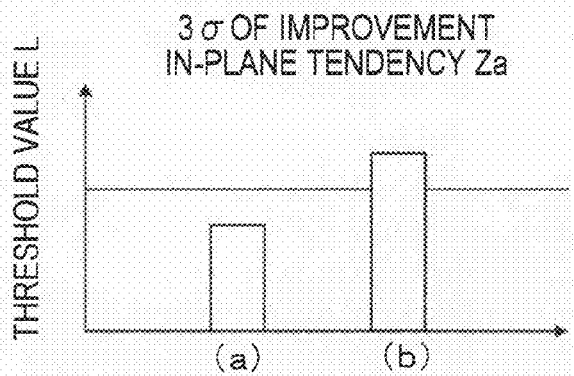
FIG. 19 is a graph showing a case when 3σ of the improvement in-plane tendency exceeds a threshold value and a case when it does not exceed.

When 3σ of the improvement in-plane tendency Za is equal to or smaller than the threshold value L as shown at (a) in FIG. 19, the change of the temperature correction values T for the thermal plate regions $R_1$ to $R_5$ is not performed, whereas when 3σ of the improvement in-plane tendency Za exceeds the threshold value L as shown at (b) in FIG. 19, the temperature correction values T for the thermal plate regions $R_1$ to $R_5$ of the thermal plate 90 are changed.

According to this example, whether or not 3σ of the improvement in-plane tendency Za of the in-plane tendency of the measured line widths within the wafer exceeds the threshold value L which has been set in advance is judged, and when it exceeds, the temperature correction values T for the thermal plate regions $R_1$ to $R_5$ of the thermal plate 90 are changed, so that the timing of changing the settings of the temperature correction values T can be stabilized irrespective of, for example, the experience and knowledge of an operator. Further, since the change of the temperature correction values T is performed only when the improvement in-plane tendency Za is large, the temperature correction values T are not changed in an unnecessary case, thus making it possible to make the timing of changing the settings of the temperature correction values T appropriate.

Note that while the necessity of changing the temperature settings is judged depending on whether or not 3σ of the improvement in-plane tendency Za exceeds the threshold value L in this example, the necessity of changing the temperature setting may be judged by expressing the magnitude of the improvement in-plane tendency Za in a difference between the maximum value and the minimum value within the wafer and comparing the difference to its threshold value.

A preferred embodiment of the present invention has been described above with reference to the accompanying drawings, and the present invention is not limited to the embodiment. It should be understood that various changes and modifications within the scope of the spirit as set forth in claims are readily apparent to those skilled in the art, and those should also be covered by the technical scope of the present invention.

While the thermal plate 90 to be temperature-set is divided into five regions in the above embodiment, any number of divisions can be selected. The shapes of the divided regions of the thermal plate 90 can also be arbitrarily selected. While the above embodiment is an example in which the temperature setting of the thermal plate 90 of the PEB unit 84 is performed based on the line widths within the wafer, the present invention is also applicable to a case of performing the temperature setting of a thermal plate for performing other thermal processing placed in a pre-baking unit, a post-baking unit or the like and the temperature setting of a cooling plate of a cooling unit for cooling the wafer W.

Further, while the temperature setting of thermal plate is performed based on the line widths within the wafer in the above embodiment, the temperature setting of a thermal processing plate of a PEB unit, a pre-baking unit or a post-baking unit based on the processing state other than the line width within the wafer, such as the angle of the side wall in the groove of the resist pattern (the side wall angle) or the film thickness of the resist pattern. Further, while the temperature setting of the thermal plate is performed based on the line width of a pattern after the photolithography process and before the etching process in the above embodiment, the temperature setting of the thermal processing plate may be performed based on the line width or the side wall angle of the pattern after the etching process. Furthermore, the present invention is also applicable to temperature setting of a thermal processing plate for thermally processing substrates other than the wafer, such as an FPD (Flat Panel Display), a mask reticle for a photomask, and the like.

The present invention is useful in performing the temperature setting of a thermal processing plate for mounting and thermally processing a substrate thereon.

What is claimed is:

1. A temperature setting method of a thermal processing plate when mounting and thermally processing a substrate thereon, said method comprising the steps of:

dividing the thermal processing plate into a plurality of regions within a thermal processing chamber;

setting a temperature for each of the regions with a controllable heater; and adjusting an in-plane temperature of the thermal processing plate by setting a temperature correction value for each of the regions, said adjusting step comprising the steps of:

measuring line widths of a resist pattern of the substrate for a substrate which has been subjected to a series of substrate processing including thermal processing said line widths being defined along a thickness direction of the substrate; and subtracting an improvement component improved by change of the temperature correction values for the regions of the thermal processing plate from the measured line widths of the substrate to calculate line widths of the substrate after the change of the temperature correction values for the thermal processing plate, wherein said improvement component is found by an expression, $$Za = -1 \times \alpha \times F(T)$$

where

Za: an improvement component,

α: a conversion coefficient between temperature variation amounts within the substrate and the line widths of the substrate, F(T): a function of the temperature correction values for the regions of the thermal processing plate and the temperature variation amounts within the substrate, and T: temperature correction values for the regions of the thermal processing plate.

2. The temperature setting method of a thermal processing plate as set forth in claim 1, wherein the temperature correction values T for the regions of the thermal processing plate are approximate values, and wherein the temperature correction values T are obtained by calculating a plurality of in-plane tendency components from the measured line widths of the substrate, and performing approximate calculation of the temperature correction values to bring an in-plane tendency component improvable by the change of the temperature correction values for the regions of the thermal processing plate of the plurality of in-plane tendency components to zero, the in-plane tendency being a line width of the resist pattern at a plurality of points in the thickness direction within the substrate.

3. The temperature setting method of a thermal processing plate as set forth in claim 1, further comprising:

decomposing the processing states of the substrate and the improvement component using a Zernike polynomial into and expressed in a plurality of in-plane tendency components.

4. The temperature setting method of a thermal processing plate as set forth in claim 1, wherein the series of substrate processing forms the resist pattern on the substrate in a photolithography process.

5. The temperature setting method of a thermal processing plate as set forth in claim 4, wherein the thermal processing includes heating processing performed after exposure processing and before a developing treatment.

6. A temperature setting apparatus for setting a temperature of a thermal processing plate when mounting and thermally processing a substrate thereon, the apparatus comprising:

the thermal processing plate divided into a plurality of regions, a temperature being settable for each of the regions, and a temperature correction value for adjusting an in-plane temperature of the plate being settable for each of the regions, wherein said temperature setting apparatus performs a process of:

measuring line widths of a resist pattern of the substrate for a substrate which has been subjected to a series of substrate processing including thermal processing said line widths being defined along a thickness direction of the substrate; and subtracting an improvement component improved by change of the temperature correction values for the regions of the thermal processing plate from the measured line widths of the substrate to calculate line widths of the substrate after the change of the temperature correction values for the thermal processing plate, wherein said improvement component is found by an expression, $Za = -1 \times \alpha \times F(T)$ where
Za: an improvement component,
α: a conversion coefficient between the temperature variation amounts within the substrate and the line widths of the substrate,
F(T): a function of the temperature correction values for the regions of the thermal processing plate and the temperature variation amounts within the substrate, and
T: temperature correction values for the regions of the thermal processing plate.

7. The temperature setting apparatus for a thermal processing plate as set forth in claim 6, wherein the temperature correction values T for the regions of the thermal processing plate are approximate values, and wherein the temperature correction values T are obtained by calculating a plurality of in-plane tendency components from the measured line widths of the substrate, and performing approximate calculation of the temperature correction values to bring an in-plane tendency component improvable by the change of the temperature correction values for the regions of the thermal processing plate of the plurality of in-plane tendency components to zero, the in-plane tendency being a line width of the resist pattern at a plurality of points in the thickness direction within the substrate.

8. The temperature setting apparatus for a thermal processing plate as set forth in claim 7, wherein the processing states of the substrate and the improvement component are decomposed using a Zernike polynomial into and expressed in a plurality of in-plane tendency components.

9. The temperature setting apparatus for a thermal processing plate as set forth in claim 6, wherein the series of substrate processing forms the resist pattern on the substrate in a photolithography process.

10. The temperature setting apparatus for a thermal processing plate as set forth in claim 9, wherein the thermal processing includes heating processing performed after exposure processing and before a developing treatment.

* * * * *